United States Patent
Winstead et al.

(10) Patent No.: US 8,962,416 B1
(45) Date of Patent: Feb. 24, 2015

(54) SPLIT GATE NON-VOLATILE MEMORY CELL

(71) Applicants: Brian A. Winstead, Austin, TX (US);
Cheong Min Hong, Austin, TX (US);
Sung-Taeg Kang, Austin, TX (US);
Konstantin V. Loiko, Austin, TX (US);
Jane A. Yater, Austin, TX (US)

(72) Inventors: Brian A. Winstead, Austin, TX (US);
Cheong Min Hong, Austin, TX (US);
Sung-Taeg Kang, Austin, TX (US);
Konstantin V. Loiko, Austin, TX (US);
Jane A. Yater, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/954,205

(22) Filed: Jul. 30, 2013

(51) Int. Cl.
*H01L 21/8238* (2006.01)
*H01L 29/66* (2006.01)
*H01L 29/792* (2006.01)

(52) U.S. Cl.
CPC ........ *H01L 29/66833* (2013.01); *H01L 29/792* (2013.01)
USPC ............. 438/201; 438/257; 257/E21.179; 257/E21.422; 257/E21.68

(58) Field of Classification Search
CPC .............. H01L 29/788; H01L 29/7841; H01L 27/10802; H01L 27/11517; H01L 29/42324; H01L 29/42328; H01L 29/66825
USPC .................. 438/201, 211, 257, 264, 593; 257/E21.179, E21.422, E21.68
See application file for complete search history.

(56) References Cited

U.S. PATENT DOCUMENTS 7,416,945 B1 * 8/2008 Muralidhar et al. .......... 438/267
7,795,091 B2    9/2010 Winstead et al.

* cited by examiner

*Primary Examiner* — Hoai V Pham

(57) ABSTRACT

A method of making a semiconductor structure uses a substrate having a background doping of a first type. A gate structure has a gate dielectric on the substrate and a select gate layer on the gate dielectric. Implanting is performed into a first portion of the substrate adjacent to a first end with dopants of a second type. The implanting is prior to any dopants being implanted into the background doping of the first portion which becomes a first doped region of the second type. An NVM gate structure has a select gate, a storage layer having a first portion over the first doped region, and a control gate over the storage layer. Implanting at a non-vertical angle with dopants of the first type forms a deep doped region under the select gate. Implanting with dopants of the second type forms a source/drain extension.

20 Claims, 4 Drawing Sheets

SPLIT GATE NON-VOLATILE MEMORY CELL

BACKGROUND

1. Field

This disclosure relates generally to methods of making semiconductor structures, and more specifically, to split gate non-volatile memory cells.

2. Related Art

Split gate non-volatile memories (NVMs) have been developed as providing advantages over the typical control gate over a floating gate. One advantage is that program disturb is reduced for memory cells that are unselected but are either on the selected row or in the alternative on the selected column. Normally cells on the selected row or the selected column are the most likely to be a problem for disturb regardless of the operation that is being performed on a selected cell. With the split gate memory cell having substantially solved the program disturb problem for cells on the selected rows or columns, a disturb problem with cells on unselected rows and unselected columns can be an issue. Another issue is the need to have a threshold voltage on the select gate that is high enough to avoid leakage, which conflicts with the low threshold voltage on the control gate desired to avoid read disturb issues.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods for split gate non-volatile memory are disclosed that uses a select gate to mask threshold voltage implants, resulting in a threshold voltage implant for the select gate that is independent from a threshold voltage implant for the control gate. Using the select gate structure as a mask eliminates a masking step in the process of manufacturing the non-volatile memory devices, thus saving time and cost. Additionally, improved performance is achieved over previous methods and structures that used a strong select gate threshold voltage implant followed by a counterdoping implant under the control gate to reduce threshold voltage under the control gate compared to the select gate. This is better understood by reference to the following description and the drawings.

Figure 1:
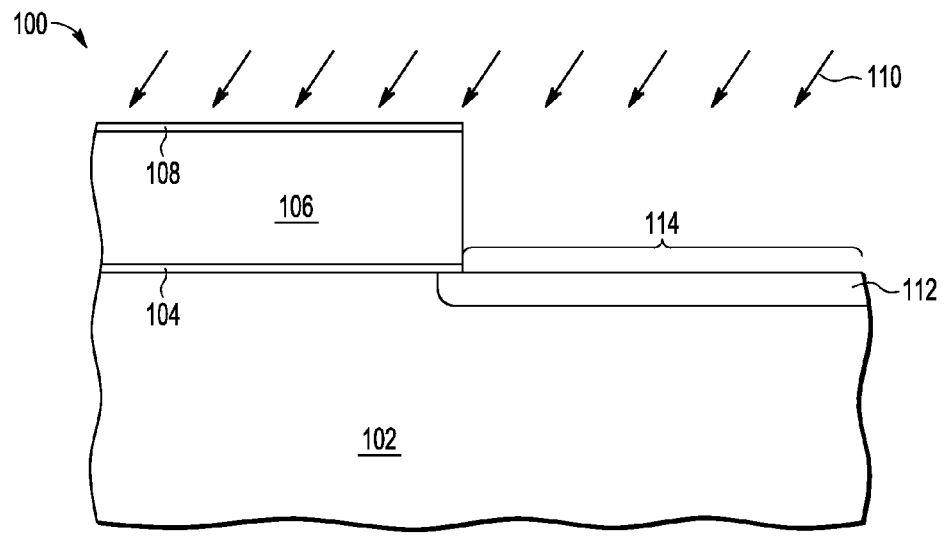
FIG. 1 is a semiconductor device at a stage in processing according to a first embodiment.

Shown in FIG. 1 is an embodiment of semiconductor structure 100 comprising a semiconductor substrate 102, a gate dielectric 104 on a portion of semiconductor substrate 102, a conductive layer 106, which will be used for a select gate, over gate dielectric 104, and an antireflective coating (ARC) 108 on conductive layer 106. The semiconductor substrate 102 can be any semiconductor material or combinations of materials, such as gallium arsenide, silicon germanium, silicon-on-insulator (SOI), silicon, monocrystalline silicon, the like, and combinations of the above. For an N-channel device, substrate 102 can be lightly doped with P-type material. For a P-channel device, substrate 102 may be lightly doped with N-type material. Gate dielectric 104 may be a grown oxide which is common for gate dielectrics and may be 2 nanometers or other suitable dimension in thickness. A high K dielectric may also be used and would likely have a different thickness. Conductive layer 106 may be doped polysilicon or other suitable material approximately 150 nanometers or other suitable thickness.

An implant 110 is performed in which a species with a doping or conductivity type opposite the doping or conductivity type of the substrate is used to create control gate threshold voltage implant region 112 using select gate layers (104, 106, 108) as a mask. For example, for an N-channel device, arsenic or antimony may be implanted in substrate 102 at a dose ranging from $5\times10^{11}$ to $5\times10^{12}$ atoms per square centimeter at a tilt angle ranging from 10 to 45 degrees from vertical at an implant energy ranging from 15 to 50 kiloelectron volts. Other suitable dosage concentrations, tilt angles and implant energies can be used, however, to achieve the desired threshold voltage for a control gate to be subsequently formed. Implant region 112 extends from under a portion less than half the width of select gate layers (104, 106, 108) to an exposed portion 114 of substrate 102 adjacent select gate layers (104, 106, 108).

Figure 2:
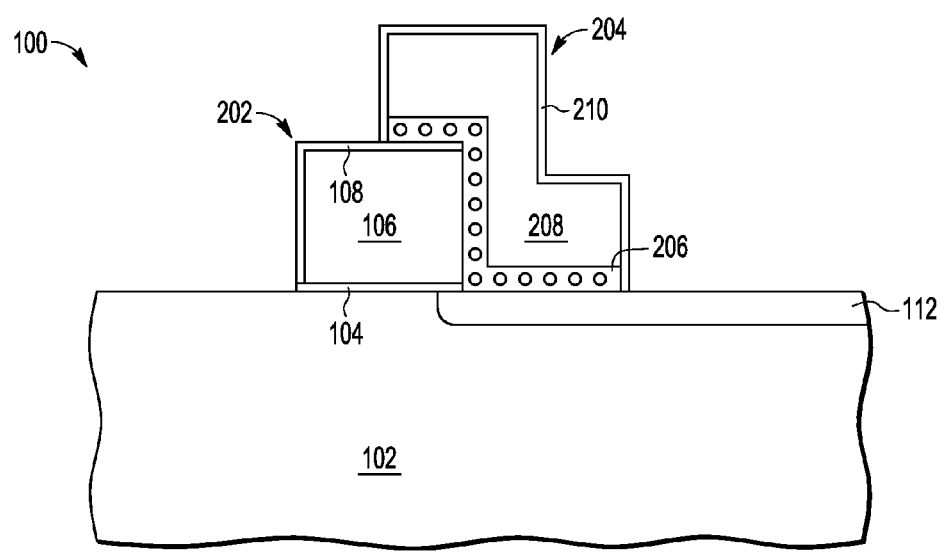
FIG. 2 is the semiconductor device of FIG. 1 at a subsequent stage in processing.

Shown in FIG. 2 is an embodiment of semiconductor structure 100 after performing an etch to remove a portion of select gate layers 104, 106, 108 to form select gate stack 202. Control gate stack 204 is formed by depositing (and/or growing) and etching charge storage layer 206 and conductive layer 208 over select gate stack 202 and exposed portions of substrate 102. Charge storage layer 206 can include a bottom dielectric layer having a low dielectric constant (e.g., silicon oxide) or a relatively high dielectric constant greater than approximately 7-7.5 (i.e., greater than silicon nitride). The bottom dielectric layer may be about 40 to 100 Angstroms or other suitable dimension in thickness. Discrete charge storage elements can then be deposited on the top and side of ARC layer 108 and the bottom dielectric layer. The charge storage elements may be formed by depositing and annealing discrete storage elements of polysilicon, germanium, metal, silicon carbide, or other suitable metal or silicon material or any combinations of these materials. In the illustrated embodiment, charge storage layer 206 includes small circles representing nanocrystals, however, charge storage layer 206 may include a continuous layer of charge trapping material or other suitable material. A top dielectric layer is then formed as part of charge storage layer 206 to isolate the charge storage elements from subsequently formed layers.

Conductive layer 208 may be doped polysilicon but could be another conductive material or combination of materials. Charge storage layer 206 and conductive layer 208 are patterned and etched to form control gate stack 204 overlapping a portion of the top and one side of select gate stack 202, and a portion of control gate threshold voltage implant 112, in subsequent steps. A protective liner material 210 can be deposited over the exposed top and side portions of control gate stack 204 and select gate stack 202. Select gate stack 202 with partially overlapping control gate stack 204 is referred to as a split gate structure.

Figure 3:
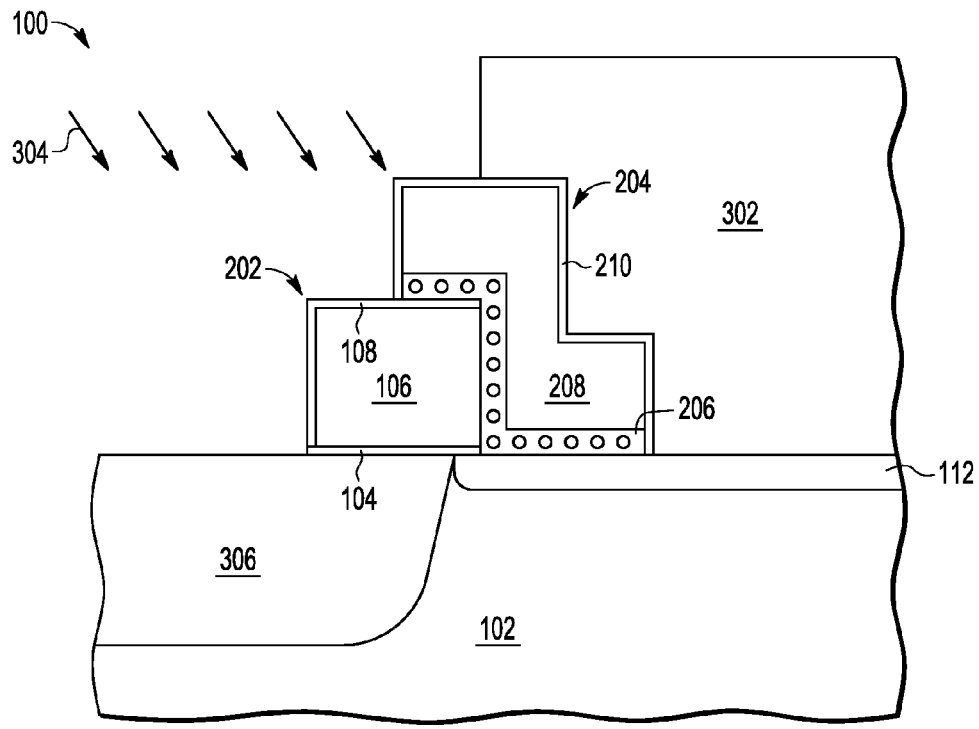
FIG. 3 is the semiconductor device of FIG. 2 at a subsequent stage in processing.

Shown in FIG. 3 is an embodiment of semiconductor structure 100 after mask 302 has been formed over some or all of control gate stack 204. An implant 304 is performed with a conductivity type or dopant species of the same type as the substrate 102 to create select gate threshold voltage implant and halo implant region 306. For example, for an N-channel device, boron or boron difluoride may be implanted in substrate 102 at a concentration ranging from 1e13 to 1e14 atoms per square centimeter at a tilt angle ranging from 30 to 45 degrees from vertical at an implant energy ranging from 30 to 120 kiloelectronvolts. Other suitable dosage concentrations, tilt angles and implant energies can be used, however, to achieve the desired threshold voltage for the select gate 106. Given the higher dosage concentration and implant energy of implant 304 compared to implant 110 (FIG. 1), implant region 306 extends much deeper in substrate 102 than implant region 112. Implant region 306 extends between at least one-half of the width but less than the full width of select gate stack 202, and may slightly overlap implant region 112.

Figure 4:
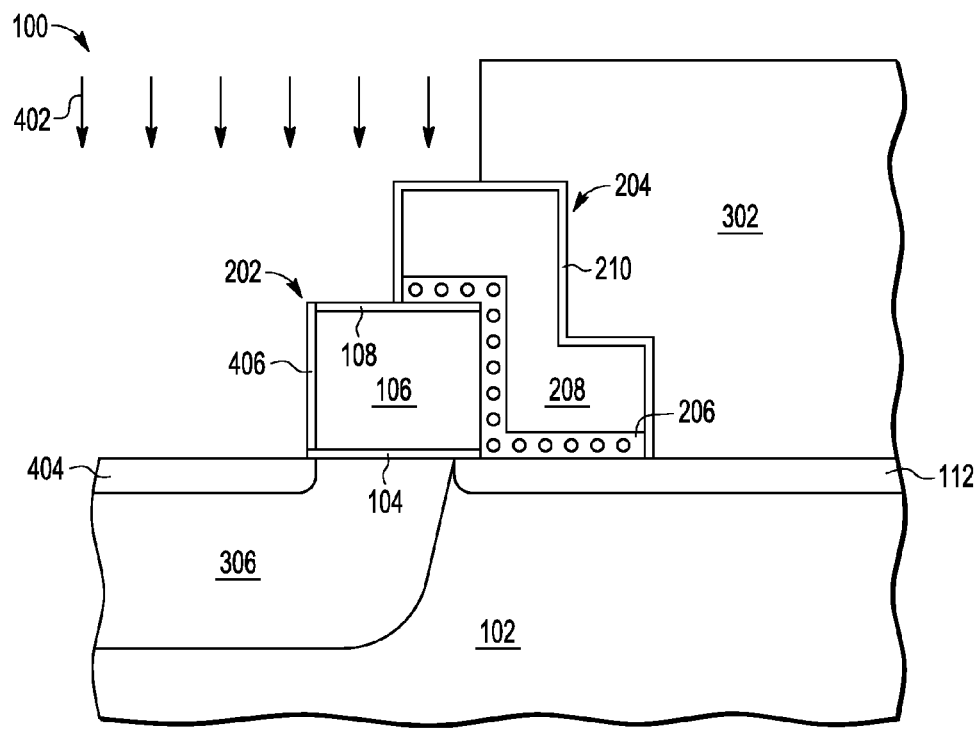
FIG. 4 is the semiconductor device of FIG. 3 at a subsequent stage in processing.

Shown in FIG. 4 is an embodiment of semiconductor structure 100 after an implant 402 is performed in which a dopant species of a doping type opposite the doping type of the substrate 102 is used to create extension implant 404 adjacent sidewall 406 of select gate stack 202. Sidewall 406 is opposite the side of select gate stack 202 overlapped by control gate stack 204. Extension implant 404 can be self-aligned with sidewall 406 and can be, for example, arsenic or antimony implanted in substrate 102 at any suitable dosage concentration and implant energy to achieve the desired read and write performance for structure 100. Implant region 404 can have approximately the same depth in substrate 102 as implant region 112, or other suitable depth.

Figure 5:
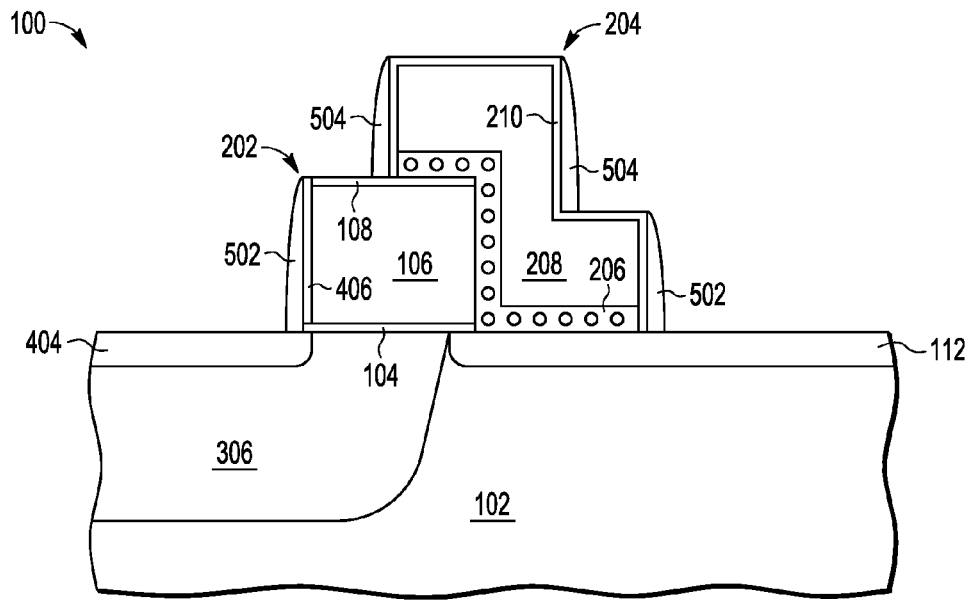
FIG. 5 is the semiconductor device of FIG. 4 at a subsequent stage in processing.

Shown in FIG. 5 is an embodiment of semiconductor structure 100 after sidewall spacers 502 and 504 are formed on sidewalls of liner material on select gate stack 202 and control gate stack 204 using conventional processing techniques. Spacer 502 is formed adjacent liner material on sidewall 406 of select gate stack 202 and adjacent liner material on sidewall 606 of a lower portion of control gate stack 204. Spacer 504 is formed adjacent liner material on sidewalls 608, 610 of an upper portion of control gate stack 204.

Figure 6:
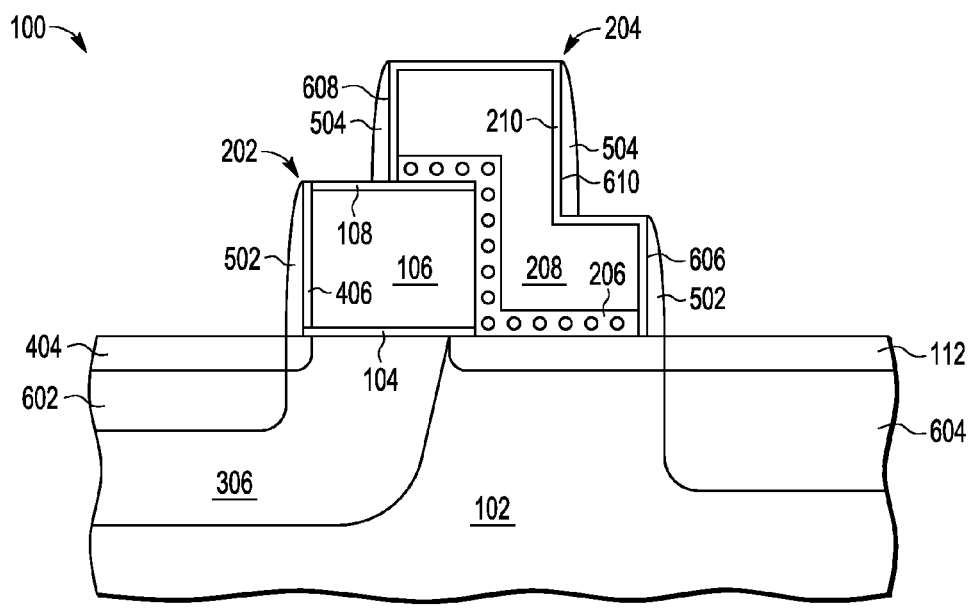
FIG. 6 is the semiconductor device of FIG. 5 at a subsequent stage in processing.

Shown in FIG. 6 is an embodiment of semiconductor structure 100 after deep source/drain regions 602, 604 of N-type material are implanted self-aligned with spacer 502 adjacent sidewall 406 of select gate stack 202 and sidewall 606 of control gate stack 204. Source/drain region 602 has less depth in substrate 102 than source/drain region 604 due to select gate halo implant region 306 acting as a P-well that partially compensates the charge of the N-type material implant. For example, in one embodiment, the depth of source/drain region 602 in substrate 102 is less than half the depth of source/drain region 604.

Figure 7:
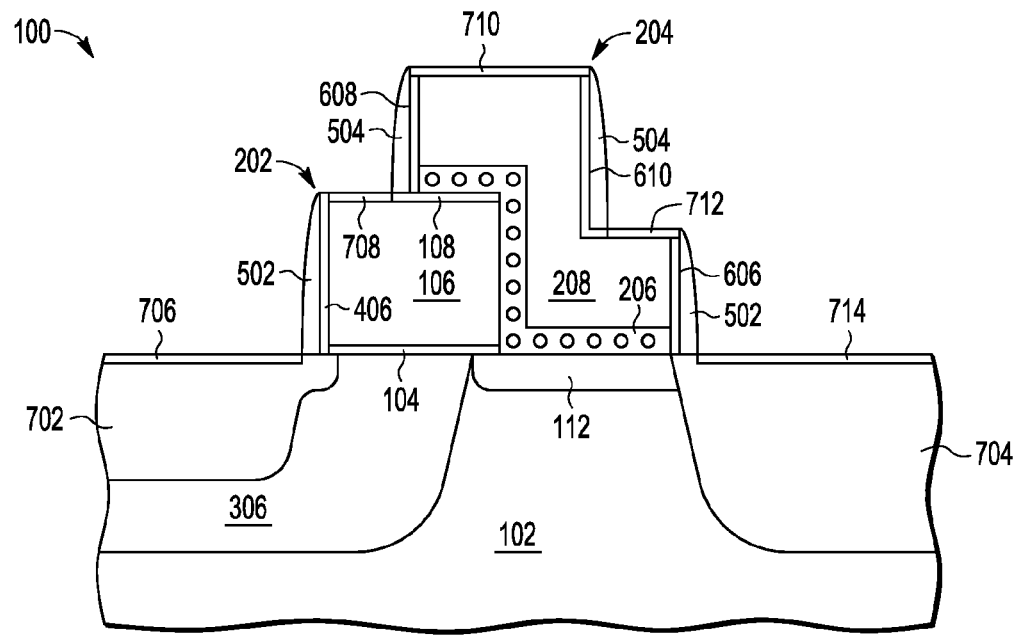
FIG. 7 is the semiconductor device of FIG. 6 at a subsequent stage in processing.

Shown in FIG. 7 is an embodiment of semiconductor structure 100 after an anneal has been performed to activate doping in implant regions 602/404 and 112/604 to create a select gate source/drain region 702 and control gate source/drain region 704. A portion of control gate implant region 112 remains under a portion of control gate stack 204 and a portion of select gate stack 202. When charge storage layer 206 is discharged and the control gate stack 204 is biased to a read voltage, an N-channel is formed under control gate stack 204. When charge storage layer 206 is programmed with electrons, the N-channel is not formed. When select gate 106 is biased above the select gate threshold voltage, an N-channel forms in an inversion layer under dielectric layer 104. At this stage, semiconductor structure 100 can be referred to as split gate memory cell.

Region 706 above select gate source/drain region 702, region 708 on top of a portion of select gate stack 202, region 710, 712 on top of portions of control gate stack 204, and region 714 above control gate source/drain region 704 can be silicided using conventional processing techniques.

Figure 8:
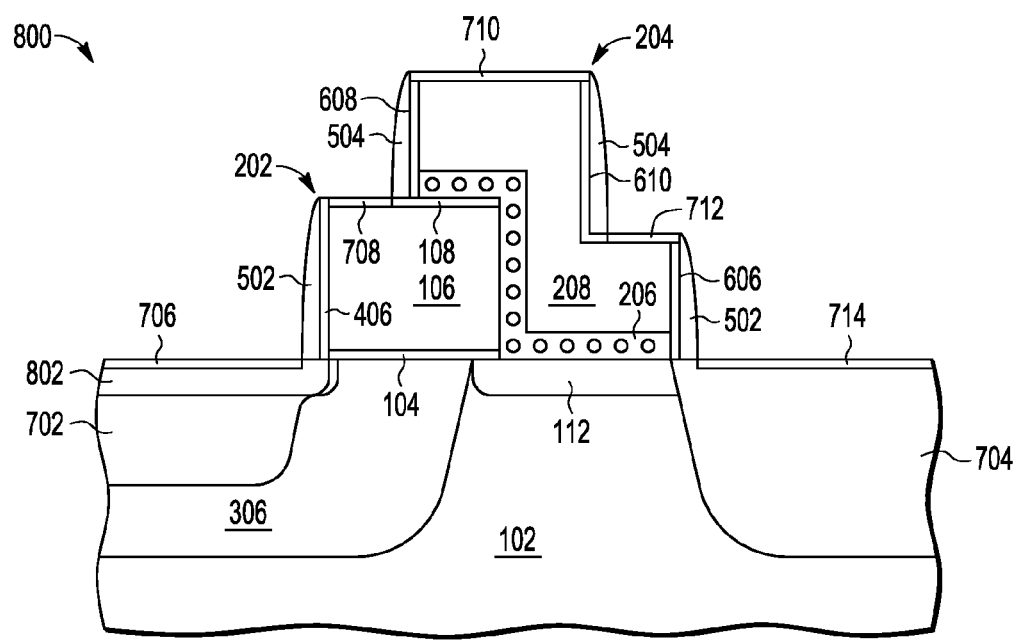
FIG. 8 is another embodiment of a semiconductor device in accordance with the invention.

Shown in FIG. 8 is another embodiment of a semiconductor structure 800 that includes a select gate extension implant region 802 under a portion of select gate stack 202 and extending adjacent select gate stack 202 that is formed at the same time as implant region 112. Accordingly, select gate stack 202 is etched before implant regions 112 and 802 are formed.

In some embodiments, an array of devices 100 can be formed on a single substrate 102 along with logic and input/output devices (not shown) such as transistors.

Semiconductor structure 100 may undergo further processing as known by those skilled in the art such as, for example, one or more metal interconnect layers (not shown) may be formed to provide electrical connections for components on semiconductor structure 100.

Also note that a number of intermediate steps have been left out of the description, such as for example, formation of shallow trench isolation (STI), various cleaning steps, multiple steps of gate dielectric formation, various implants, anneal steps, and the like, that one of ordinary skill in the art would know are necessary or desirable in the manufacture of an integrated circuit.

By now it should be appreciated that, in some embodiments, there has been provided a method of making a semiconductor structure (100) using a substrate (102) having a background doping of a first conductivity type. A gate structure is formed comprising a gate dielectric (104) on the substrate and a select gate layer (106) on the gate dielectric. The gate layer has a first end. A first portion of the substrate is implanted (110) adjacent to the first end with dopants of a second conductivity type using the first end as a mask. The implanting is performed prior to any dopants being implanted into the background doping of the first portion. The first portion becomes a first doped region of the second conductivity type. A non-volatile memory gate structure is formed comprising a select gate (106 FIG. 2) of the select gate layer, a storage layer having a first portion over the first doped region, and a control gate (208) over the storage layer. The select gate has a first side as the first end and a second side opposite the first side. The storage layer has a second portion between the first side of the select gate and a first side of the control gate. Dopants of the first conductivity type are implanted (304) at a non-vertical angle to form a deep doped region (306) under substantially all of the select gate. Dopants of the second conductivity type are implanted (402) to from a source/drain extension (404) in the substrate substantially aligned with the second side of the select gate.

In another aspect, the control gate can have a second side opposite the first side of the control gate. A sidewall spacer (502) can be formed along the second side of the select gate and the second side of the control gate. Dopants of the second conductivity type can be implanted using the sidewall spacer as a mask to form a deep source/drain region (602) in the substrate substantially aligned to the second side of the select gate and a deep source/drain region (604) in the substrate substantially aligned to the second side of the control gate.

In another aspect, a silicide layer (706) can be formed on deep source/drain region (702) and a silicide layer (714) on deep source/drain region (704).

In another aspect, the storage layer can comprise nanocrystals.

In another aspect, the gate stack can further comprise a dielectric layer on the select gate layer.

In another aspect, the implanting at a non-vertical angle can be further characterized as using the control gate as a mask.

In another aspect, the implanting at a non-vertical angle can be further characterized as using a layer of patterned photoresist as a mask.

In another aspect, the dopants of the second conductivity type implanted during the implanting the first portion can be the only dopants in addition to the dopants of the background doping in all of the substrate.

In another aspect, the implanting at the non-vertical angle can be further characterized as implanting a dopant comprising one of a group consisting of boron difluoride and boron.

In another aspect, the select gate is formed by etching the select gate layer to form the select gate with the second side.

In another aspect, the select gate layer has the second side and the implanting the first portion of the substrate can be further characterized as implanting a second portion of the substrate adjacent to the second side of the select gate layer.

In another aspect, the implanting the first portion of the substrate can be further characterized as being non-vertical.

In another aspect, the forming the non-volatile memory gate structure can be further characterized by the storage layer extending over a portion of the select gate and the control gate extending over the storage layer where the storage layer extends over the portion of the select gate.

In another embodiment, a split gate memory cell using a substrate having a background doping of a first conductivity type can comprise a non-volatile memory gate structure comprising a gate dielectric (104) on the substrate, a select gate (106) on the gate dielectric having a first side and a second side, a storage layer (206) that is along the first side of the select gate and over a first portion of the substrate adjacent to the first side of the select gate, and a control gate (208), which has a first portion over the storage layer where the storage layer is over the first portion of the substrate. The control gate can have a first side adjacent to the storage layer where the storage layer is along the first side of the select gate, and the control gate can have a second side opposite the first side of the control gate. A first doped region (112) in the substrate can be under the first portion of the control gate. The doped region can have dopants of a second conductivity type sufficient for the first doped region to be of the second conductivity type and all dopants of the first conductivity type can be only from the background doping of the substrate. A second doped region (306) of the first conductivity type can have a greater concentration than the background doping in the substrate under the select gate. A third doped region (702) of the second conductivity in the substrate can be substantially aligned to the second side of the select gate. A fourth doped region (704) of the second conductivity type can be in the substrate adjacent to the first doped region.

In another aspect, the storage layer can extend over a portion of the select gate and the control gate can extend over the storage layer where the storage layer extends over the select gate.

In another aspect, the second doped region can extend from a top surface of substrate to a first depth and function as a threshold adjust for a select gate transistor portion of the split gate memory cell. The first doped region can extend from a surface of the substrate to a second depth and functions as an only threshold adjust to the background doping for a control gate portion of the split gate memory cell. The first depth is greater than the second depth.

In another aspect, the split gate memory cell can further comprise a sidewall spacer on the second side of the select gate and the second side of the control gate.

In another aspect, the first doped region can form a PN junction with the second doped region. The PN junction can be at the surface of the substrate and under the select gate.

In another aspect, the storage layer can comprise nanocrystals.

In still another embodiment, a method of making split gate memory cell (100) using a substrate (102) having a background doping of a first conductivity type can comprise forming a select gate structure (106) over a gate dielectric (104). The gate structure has a first end. A shallow, non-vertical implant (110) can be performed using the select gate structure as a mask to obtain a doped region (112) in a first portion in the substrate adjacent to the first end. The non-vertical implant can be the only implant into the background doping of the first portion. A non-volatile gate structure (106, 206, 208) can be formed using the select gate structure in forming a select gate transistor portion of the split gate memory cell. The non-volatile gate structure can include a control gate structure over the doped region with a storage layer between the control gate structure and the doped region for use in a control gate transistor portion of the split gate memory cell. A deep, non-vertical implant (306) of dopants of the first conductivity type can be performed into a channel region of the select gate transistor portion as a threshold adjust of the select gate transistor portion. The deep non-vertical implant can be deeper than the shallow, non-vertical implant.

Although the disclosure has been described with respect to specific conductivity types or polarity of potentials, skilled artisans appreciated that conductivity types and polarities of potentials may be reversed.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, a top oxide and a bottom oxide were described but another insulating material may be substituted. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate having a background doping of a first conductivity type, comprising:
    forming a gate structure comprising a gate dielectric on the substrate and a select gate layer on the gate dielectric, wherein the gate layer has a first end;
    implanting a first portion of the substrate adjacent to the first end with dopants of a second conductivity type using the first end as a mask, wherein the implanting is prior to any dopants being implanted into the background doping of the first portion and wherein the first portion becomes a first doped region of the second conductivity type;
    forming a non-volatile memory gate structure comprising a select gate of the select gate layer, a storage layer having a first portion over the first doped region, and a control gate over the storage layer, wherein the select gate has a first side as the first end and a second side opposite the first side, wherein the storage layer has a second portion between the first side of the select gate and a first side of the control gate;
    implanting at a non-vertical angle with dopants of the first conductivity type to form a deep doped region under substantially all of the select gate; and
    implanting with dopants of the second conductivity type to from a source/drain extension in the substrate substantially aligned with the second side of the select gate.

2. The method of claim 1, wherein the control gate has a second side opposite the first side of the control gate, further comprising:
    forming a sidewall spacer along the second side of the select gate and the second side of the control gate; and
    implanting with dopants of the second conductivity type using the sidewall spacer as a mask to form a deep source/drain region in the substrate substantially aligned to the second side of the select gate and a deep source/drain region in the substrate substantially aligned to the second side of the control gate.

3. The method of claim 2 further comprising:
    forming a silicide layer on deep source/drain region and a silicide layer on the control gate.

4. The method of claim 1, wherein the storage layer comprises nanocrystals.

5. The method of claim 1 wherein the gate structure further comprises a dielectric layer on the select gate layer.

6. The method of claim 1, wherein the implanting at a non-vertical angle is further characterized as using the control gate as a mask.

7. The method of claim 1, wherein the implanting at a non-vertical angle is further characterized as using a layer of patterned photoresist as a mask.

8. The method of claim 1, wherein the dopants of the second conductivity type implanted during the implanting the first portion are the only dopants in addition to the dopants of the background doping in all of the substrate.

9. The method of claim 1, wherein the implanting at the non-vertical angle is further characterized as implanting a dopant comprising one of a group consisting of boron difluoride and boron.

10. The method of claim 1, wherein the select gate is formed by etching the select gate layer to form the select gate with the second side.

11. The method of claim 1, wherein the select gate layer has the second side and wherein the implanting the first portion of the substrate is further characterized as implanting a second portion of the substrate adjacent to the second side of the select gate layer.

12. The method of claim 1, wherein the implanting the first portion of the substrate is further characterized as being non-vertical.

13. The method of claim 1, wherein the forming the non-volatile memory gate structure is further characterized by the storage layer extending over a portion of the select gate and the control gate extending over the storage layer where the storage layer extends over the portion of the select gate.

14. A method of making split gate memory cell using a substrate having a background doping of a first conductivity type, comprising:
    forming a select gate structure over a gate dielectric, wherein the select gate structure has a first end;
    performing a shallow, non-vertical implant using the select gate structure as a mask to obtain a doped region in a first portion in the substrate adjacent to the first end, wherein the non-vertical implant is the only implant into the background doping of the first portion;
    forming a non-volatile gate structure using the select gate structure in forming a select gate transistor portion of the split gate memory cell, wherein the non-volatile gate structure includes a control gate structure over the doped region with a storage layer between the control gate structure and the doped region for use in a control gate transistor portion of the split gate memory cell; and
    then performing a deep, non-vertical implant of dopants of the first conductivity type into a channel region of the select gate transistor portion as a threshold adjust of the select gate transistor portion, wherein the deep non-vertical implant is deeper than the shallow, non-vertical implant.

15. A method of making a split gate non-volatile memory cell using a substrate having a background doping of a first conductivity type, comprising:
    forming a gate dielectric on the substrate;
    forming a select gate on the gate dielectric having a first side and a second side;
    forming a storage layer that is along the first side of the select gate and over a first portion of the substrate adjacent to the first side of the select gate; and
    forming a control gate, which has a first portion over the storage layer where the storage layer is over the first portion of the substrate, wherein the control gate has a first side adjacent to the storage layer where the storage layer is along the first side of the select gate, and wherein the control gate has a second side opposite the first side of the control gate;
    implanting a first doped region in the substrate under the first portion of the control gate, wherein the doped region has dopants of a second conductivity type sufficient for the first doped region to be of the second conductivity type and all dopants of the first conductivity type are only from the background doping of the substrate;
    implanting a second doped region of the first conductivity type having a greater concentration than the background doping in the substrate under the select gate;
    implanting a third doped region of the second conductivity type in the substrate substantially aligned to the second side of the select gate; and
    implanting a fourth doped region of the second conductivity type in the substrate adjacent to the first doped region.

16. The method of claim 15, wherein the storage layer extends over a portion of the select gate and the control gate extends over the storage layer where the storage layer extends over the select gate.

17. The method of claim 15, wherein:

the second doped region extends from a top surface of substrate to a first depth and functions as a threshold adjust for a select gate transistor portion of the split gate memory cell; and the first doped region extends from a surface of the substrate to a second depth and functions as an only threshold adjust to the background doping for a control gate portion of the split gate memory cell, wherein the first depth is greater than the second depth.

18. The method of claim 15, further comprising a sidewall spacer on the second side of the select gate and the second side of the control gate.

19. The method of claim 15, wherein the first doped region forms a PN junction with the second doped region, wherein the PN junction is at the top surface of the substrate and under the select gate.

20. The method of claim 15, wherein the storage layer comprises nanocrystals.

\* \* \* \* \*